(12) United States Patent
Wolf et al.

(10) Patent No.: US 7,065,699 B2
(45) Date of Patent: Jun. 20, 2006

(54) USING QUADRANT SHIFTING TO FACILITATE BINARY ARITHMETIC WITH TWO'S COMPLEMENT OPERANDS

(75) Inventors: Tod David Wolf, Richardson, TX (US); Alan Gatherer, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 444 days.

(21) Appl. No.: 10/033,110

(22) Filed: Oct. 26, 2001

(65) Prior Publication Data

US 2003/0084393 A1    May 1, 2003

(51) Int. Cl.
*H03M 13/03* (2006.01)
(52) U.S. Cl. .................. 714/786; 714/755; 375/262; 375/341
(58) Field of Classification Search ........... 714/755, 714/786, 796, 794, 795; 375/262, 341
See application file for complete search history.

(56) References Cited

U.S. PATENT DOCUMENTS 6,516,444 B1 *   2/2003   Maru .................... 714/795
6,675,342 B1 *   1/2004   Yagyu ................... 714/755
6,715,120 B1 *   3/2004   Hladik et al. ............ 714/755

OTHER PUBLICATIONS

C. Bernard Shung, Paul H. Siegel, Gottfried Ungerboeck, and Hemant K. Thapar, "VLSI Architectures for Metric normalization in Viterbi Algorithm," *IEEE ICC*, pp. 1723-1728, 1990.

Yufei Wu and Brian D. Woerner, "Internal data width in SISO decoding module with modular renormalization," Proceedings *IEEE* Vehicular Technology Conference, Tokyo, Japan, May 2000. (5 pages).

* cited by examiner

*Primary Examiner*—Albert Decady
*Assistant Examiner*—Esaw Abraham
(74) *Attorney, Agent, or Firm*—Alan K. Stewart; W. James Brady, III; Frederick J. Telecky, Jr.

(57) ABSTRACT

Operands (90) that are represented in two's complement format are prepared for use in binary arithmetic. For each operand, it is determined (91, 93) whether an original value thereof is within a predetermined proximity of a maximum positive/maximum negative value boundary associated with the two's complement format. If any of the original operand values is within the predetermined proximity, all of the original operand values are adjusted (95) to produce respectively corresponding adjusted operand values (96) for use in a binary arithmetic operation.

6 Claims, 4 Drawing Sheets

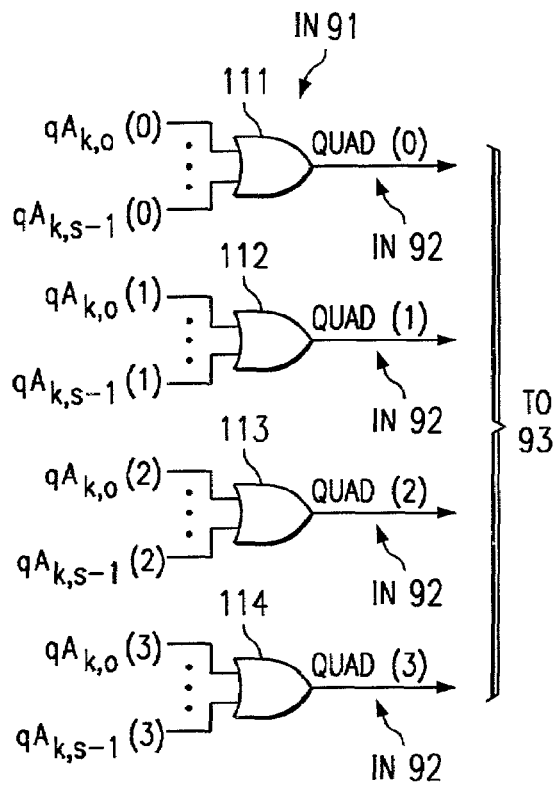
*FIG. 11*
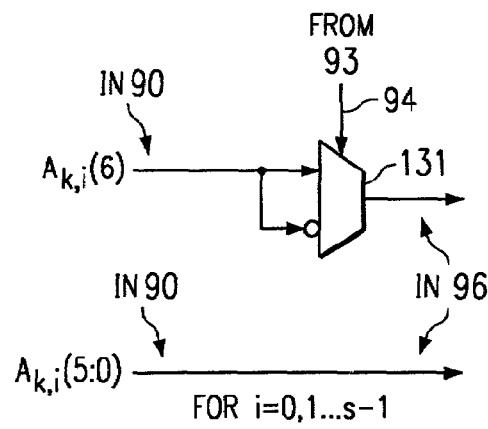
*FIG. 13*
| INPUT QUADRANT(S) | ROTATION OPERATION | OUTPUT QUADRANT(S) |
|---|---|---|
| 0 | −64 | 3 |
| 1 | −64 | 0 |
| 0 AND 1 | −64 | 0 AND 3 |
| 2 | +64 | 3 |
| 1 AND 2 | +128 | 0 AND 3 |
| 3 | +64 | 0 |
| 2 AND 3 | +64 | 0 AND 3 |
| 0 AND 3 | NONE | 0 AND 3 |
*FIG. 12*

USING QUADRANT SHIFTING TO FACILITATE BINARY ARITHMETIC WITH TWO'S COMPLEMENT OPERANDS

FIELD OF THE INVENTION

The invention relates generally to data processing using binary arithmetic and, more particularly, to binary arithmetic with two's complement operands.

BACKGROUND OF THE INVENTION

Representation of binary arithmetic operands in two's complement format is useful in many data processing applications. For example, if the precision of the operand is 8 bits, then the values of the operand will range from −128 to 127. Such a two's complement representation is often illustrated by a circle as shown in FIG. 1.

The two's complement representation has been used, for example, in the alpha and beta state metric calculation blocks of conventional turbo decoders. The two's complement representation is useful in the alpha and beta state metric calculations because the value of these metrics increases during each iteration of the trellis. When, for example, a binary operand reaches the maximum positive value which can be represented by a specific number of bits, a further increase in the magnitude of that operand will cause its value to wrap around the circle to the most negative number, for example, −128 in an 8 bit representation. As a specific example, adding 2 to 127 causes an overflow to −127 as shown below:

```
   127      0111 1111
     2      0000 0010
   ---      ---------
   129      1000 0001
  −127      1000 0001
```

This wrap-around operation associated with two's complement representation advantageously normalizes operands automatically, without requiring additional normalization circuitry.

Viterbi decoders have trellis properties that are similar to turbo decoders, and part of the Viterbi decoder is comparable with either the beta or alpha state metric blocks of the turbo decoder, so two's complement representation is also conventionally used in some Viterbi decoders for similar normalization purposes. The two's complement format can be useful in many data processing applications, such as those where operand normalization is needed.

Referring again to the circle of FIG. 1, and considering the example of a turbo decoder, the two's complement technique works for the alpha and beta state metric blocks, as long as all metric values for each of the turbo decoder states reside in one-half (two adjacent quarters) of the circle for each recursive operation of the turbo decoder. If the alpha or beta state metric values for any state of the turbo decoder reside in more than two adjacent quarters of the circle, then it is not possible to determine overflows. This situation of having alpha or beta state metric values for a given state residing in more than two adjacent quarters of the circle could happen if there are not enough bits for the operands. Therefore, conventional turbo and Viterbi decoders that use two's complement normalization typically ensure that, for each iteration of the turbo decoder trellis, there are enough bits available to prevent the alpha and beta state metrics from residing in more than two adjacent quarters of the circle.

Although the use of two's complement representation can be advantageous in binary arithmetic calculations, nevertheless the present invention has discovered that problems can arise when binary arithmetic operands cross the maximum positive/maximum negative value boundary. In order to avoid these problems, the present invention provides a quadrant shifting technique wherein the values of the binary operands are adjusted (relocated on the circle) appropriately to avoid arithmetic operations that cross the maximum positive/maximum negative value boundary. Advantageously, the quadrant shifting technique can also be designed to reduce the number of bits required for two's complement representation of the operands.

BRIEF DESCRIPTION OF THE DRAWINGS

FIGS. 10 and 11, taken together, diagrammatically illustrate an exemplary embodiment of the quadrant identifier of FIG. 9.

FIG. 12 illustrates in tabular format an exemplary embodiment of the rotation selector of FIG. 9.

FIG. 13 diagrammatically illustrates an exemplary embodiment of the rotator of FIG. 9.

DETAILED DESCRIPTION

For clarity of exposition, the present invention will be described in conjunction with exemplary binary arithmetic calculations performed by the extrinsic block of a conventional turbo decoder. However, as will be apparent from the following description, the present invention is applicable to a variety of applications which utilize two's complement operands for binary arithmetic.

Figure 2:
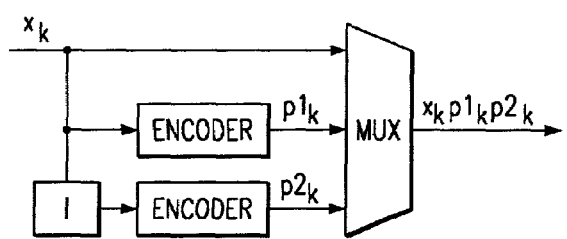
FIG. 2 illustrates a conventional turbo encoder architecture.

FIG. 2 illustrates an example of a conventional turbo encoder including parallel encoder blocks which respectively receive the systematic data $x_k$ and an interleaved version of the systematic data, and respectively produce parity data $p1_k$ and $p2_k$. The systematic data and the parity data are then multiplexed for modulation and transmission across a communication channel.

Figure 3:
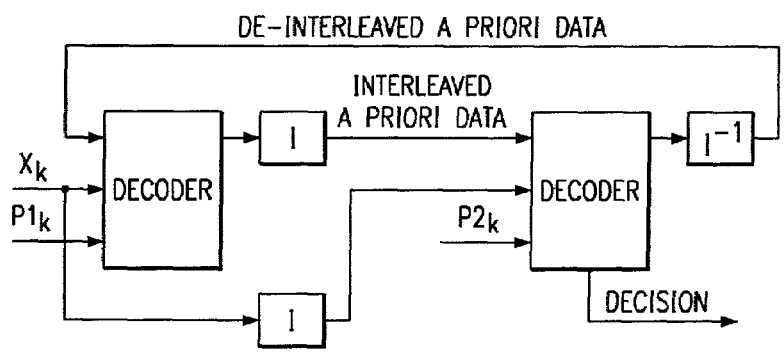
FIG. 3 illustrates a conventional turbo decoder architecture.

FIG. 3 illustrates a conventional turbo decoder which attempts to recover the original systematic data $x_k$ from the received systematic data $X_k$ and the received parity data $P1_k$ and $P2_k$. The turbo decoder of FIG. 3 includes a pair of decoder blocks which respectively correspond to the encoder blocks of FIG. 2, and interleaver and de-interleaver blocks (I and I$^{-1}$) which account for the interleaver block (I) of FIG. 2. The decoder block functions of FIG. 3 are maximum a posteriori (MAP) decoder block functions. The leftmost decoder block processes the non-interleaved data and the rightmost decoder block processes the interleaved data.

Figure 4:
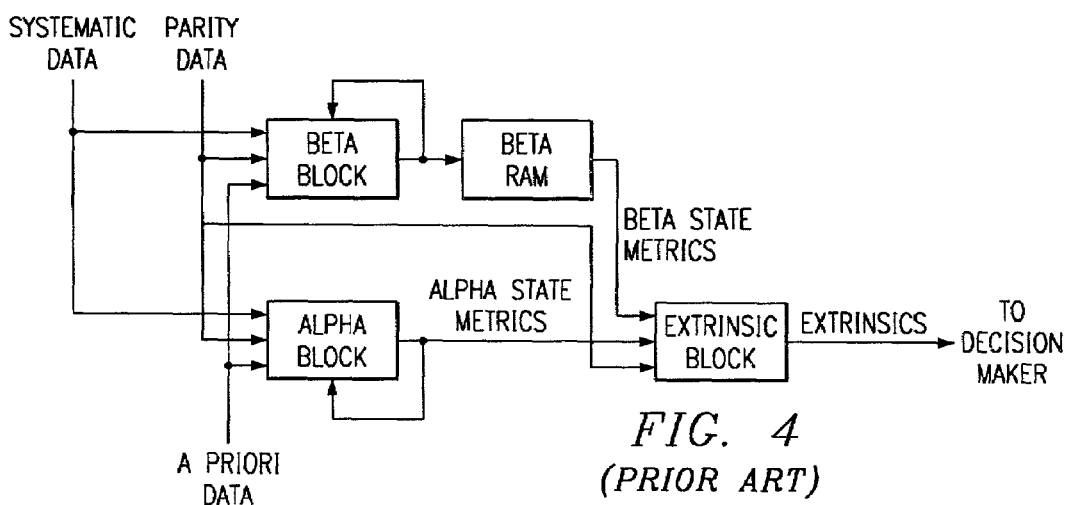
FIG. 4 illustrates the conventional decoder blocks of FIG. 3 in more detail.

FIG. 4 illustrates the decoder blocks of FIG. 3 in more detail. As shown in FIG. 4, a MAP decoder block calculates 3 vectors, namely alpha state metrics, beta state metrics and extrinsics. The alpha state metrics are produced by an alpha block, the beta state metrics are produced by a beta block (and stored in a beta RAM), and the extrinsics are produced by an extrinsic block. The extrinsic block receives as input the beta state metrics, the alpha state metrics and parity data from the communication channel. The alpha block receives as input systematic data and parity data from the communication channel, as well as a priori data, and alpha state metrics fed back from the output of the alpha block. The a priori data is either interleaved or de-interleaved extrinsics from the other MAP decoder (see also FIG. 3). The beta block receives as input systematic data and parity data from the communication channel, as well as a priori data, and beta state metrics fed back from the output of the beta block.

Figure 5:
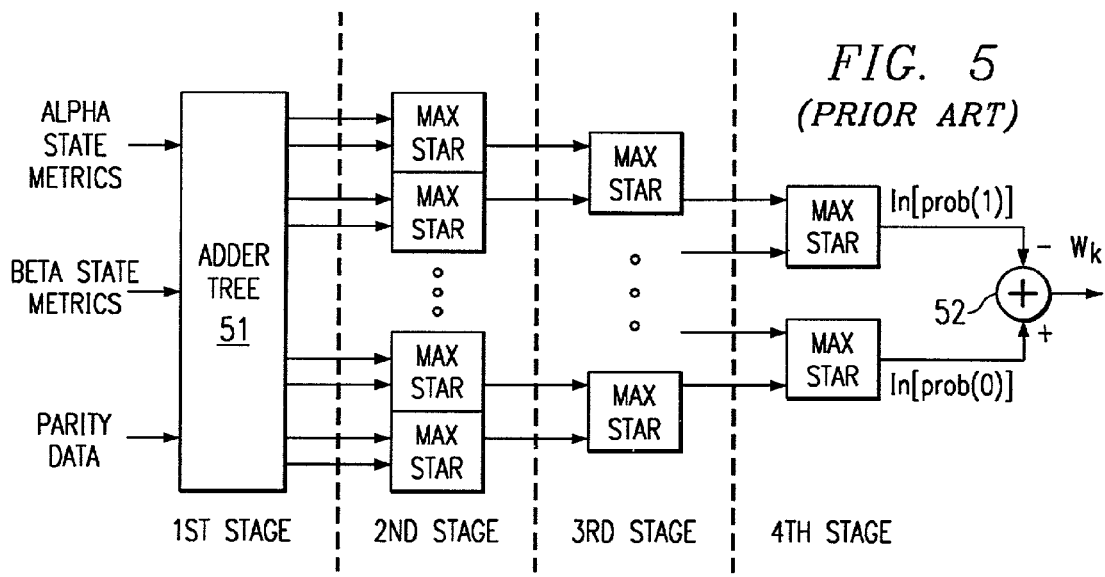
FIG. 5 illustrates the conventional extrinsic block of FIG. 4 in more detail.

FIG. 5 illustrates the extrinsic block of FIG. 4 in more detail. The first stage of the extrinsic block is an adder tree 51 which sums together the beta state metrics, the alpha state metrics and the parity data. The remaining stages of the extrinsic block include respective pluralities of MAXstar blocks which, taken together, form a MAXstar tree in which the log probability of a 1 is calculated in the top half of the tree and the log probability of a 0 is calculated in the bottom half of the tree. The log probability of a 1 is subtracted at 52 from the log probability of a 0 to generate the extrinsic, $W_k$.

The general form of the equation for the log probability of 1, for example, is:

$$\ln[\text{Prob}[1]] = \ln\left[\sum_s \exp(A_k + \Gamma_k + B_{k+1})\right]$$

where $A_k$ is the alpha metric of a given state at time k, $B_{k+1}$ is the beta metric of a given state at time k+1, $\Gamma_k$ is a summation of the systematic data, the parity data and the extrinsic data at time k, and S is the number of states.

Figure 1:
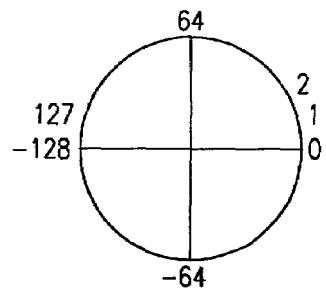
FIG. 1 is a conventional circle diagram which illustrates two's complement representation of binary numbers.

If the alpha and beta state metrics are provided in two's complement format, these metrics can range anywhere on the circle in FIG. 1. Thus, the alpha and beta state metric data entering the extrinsic block of FIG. 5 can range anywhere on that circle. Adding the alpha and beta state metrics together can be a problem if the metrics cross the maximum positive/maximum negative value boundary (for example the 127/−128 boundary of FIG. 1). In the following example, the alpha and beta state metrics for S=8 states at time k are represented in 8 bit full precision format:

$A_k$={130, 128, 125, 120, 121, 122, 124, 124}(max $(A_k)$=130)

$B_{k+1}$={124, 131, 124, 124, 124, 124, 124, 124}(max $(B_{k+1})$=131)

These same alpha and beta state metrics are as follows when represented in 8 bit two's complement format:

$A_k$={−126, −128, 125, 120, 121, 122, 124, 124}(max $(A_k)$=−126)

$B_{k+1}$={124, −125, 124, 124, 124, 124, 124, 124} (max$(B_{k+1})$=−125)

Assuming, for example, that $\Gamma_k$=−2, and using the aforementioned general form of the log probability of a 1, the full precision representation yields:

$\ln[\text{Prob}[1]]=\ln[e^{[130+131-2]}+e^{[128+124-2]}+e^{[125+124-2]}+\ldots]$ while the two's complement representation yields:

$\ln[\text{Prob}[1]]=\ln[e^{[-126-125-2]}+e^{[-128+124-2]}+e^{[125+124-2]}+\ldots]$ The exponent values in the foregoing full precision log probability expression are 259, 250, 247, . . . , in which 259 is the largest (correct answer), and the exponent values in the foregoing two's complement log probability expression are −253, −6, 247, . . . , in which −253 is not the largest (incorrect answer). Thus, because the two's complement representation causes, for example, the full precision alpha metric 130 and the full precision beta metric 131 to cross over the 127/−128 boundary to −126 and −125, respectively, the log probability expression yields an incorrect answer.

Figure 6:
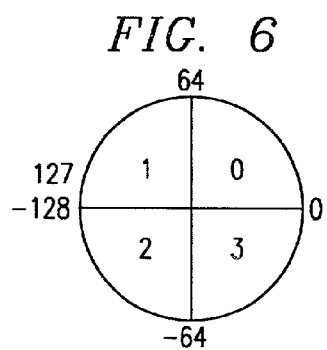
FIG. 6 is a circle diagram for two's complement representation which illustrates the quadrant shifting technique according to the invention.
Figure 7:
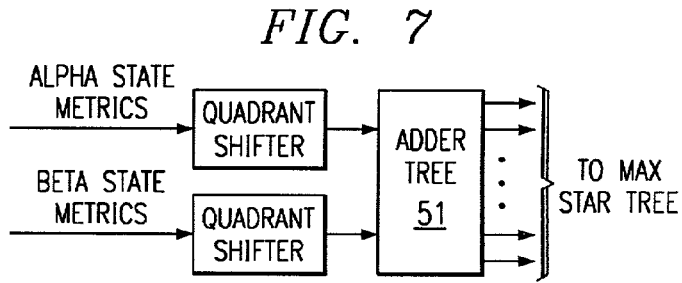
FIG. 7 diagrammatically illustrates exemplary embodiments of an extrinsic block including quadrant shifters according to the invention.

The present invention therefore provides for moving the alpha and beta state metrics around the circle of FIG. 1 such that the cross over from maximum positive to maximum negative is avoided. An exemplary approach of the present invention is illustrated in the circle of FIG. 6, wherein four quadrants 0, 1, 2 and 3 are designated. According to exemplary embodiments of the invention, alpha and beta state metrics are moved along the circle until they reside in quadrant 0, quadrant 3 or both quadrants 0 and 3. This operation is accomplished by a quadrant shifter, two of which are illustrated in FIG. 7, one for the alpha metrics and one for the beta metrics. The quadrant shifters receive the respective alpha and beta metrics, perform the necessary quadrant shifting such that the alpha and beta metrics lie in quadrant 0, quadrant 3 or quadrants 0 and 3, and then output the shifted metrics to, for example, the adder tree 51 at the first stage of the extrinsic block illustrated in FIG. 5.

The alpha and beta metrics which are input to the quadrant shifters of FIG. 7 represent data that has traversed the circle of FIG. 6 many times. The value of the data is not the most important information about the turbo decoder states. The relative difference between the data is the important thing. Therefore, adding a uniform number to all of the metrics does not change the relative difference therebetween. In the 8 bit precision example of FIG. 6, adding 64 has the effect of rotating the number counterclockwise in the circle to the next quadrant, and subtracting 64 has the effect of rotating the number clockwise in the circle to the next quadrant. Adding 128 has the effect of rotating numbers from two adjacent quadrants counter clockwise into the opposite two adjacent quadrants, for example from quadrants 1 and 2 into quadrants 3 and 0.

Referring again to the exemplary two's complement alpha and beta metrics shown above, the following modified alpha and beta state metrics (labeled as $A'_k$ and $B'_{k+1}$) are obtained by adding 128 to the two's complement representations shown above:

$A'_k$={2, 0, −3, −8, −7, −6, −4, −4}(max $A'_k$=2)

$B'_{k+1}$={−4, 3, −4, −4, −4, −4, −4, −4}(max $B'_{k+1}$=3)

Plugging these metrics into the aforementioned log probability of a 1 expression yields:

$$ln[Prob[1]]=lnfe^{[2+3-2]}+e^{[0-4-2]}+e^{[-3-4-2]}+\ldots]$$

The exponents of this expression are 3, −6, −9, ..., in which 3 is the largest (correct answer). Thus, by adding 128 to shift the metrics from quadrants 1 and 2 to quadrants 0 and 3, the above-described problem of the maximum positive/maximum negative value boundary is advantageously avoided.

The following example shows subtracting 64 from the two's complement number 97, which is in quadrant 1:

```
  97    0110 0001
 −64    1100 0000
 ───    ─────────
  33    0010 0001
```

Subtraction of 64 results in 33, thereby rotating the metric from quadrant 1 into quadrant 0. Moreover, although the input metric value of 97 uses 8 bits of precision, the output value of 33 requires only 7 bits of precision. More specifically, bits 0 through 5 of the value 33 merely replicate bits 0 through 5 of the value 97, and bit 6 of the value 97 is simply inverted to produce bit 6 of the value 33.

The following is an example of adding 64 to a two's complement value (−66) in quadrant 2:

```
 −66    1011 1110
 +64    0100 0000
 ───    ─────────
  −2    1111 1110
```

In this example, adding 64 moves the value from quadrant 2 into quadrant 3 (−2). Again, bits 0 through 5 of the value −2 are obtained by merely replicating bits 0 through 5 of the value −66, and bit 6 of the value −2 is obtained by simply inverting bit 6 of the value −66.

The following is an example of adding 128 to a two's complement value (97) in quadrant 1 in order to rotate that value to a value (−31) in quadrant 3:

```
   97    0110 0001
 +128    1000 0000
 ────    ─────────
  −31    1110 0001
```

In this example, bits 0 through 6 of the value −31 merely replicate bits 0 through 6 of the value 97.

Figure 7A:
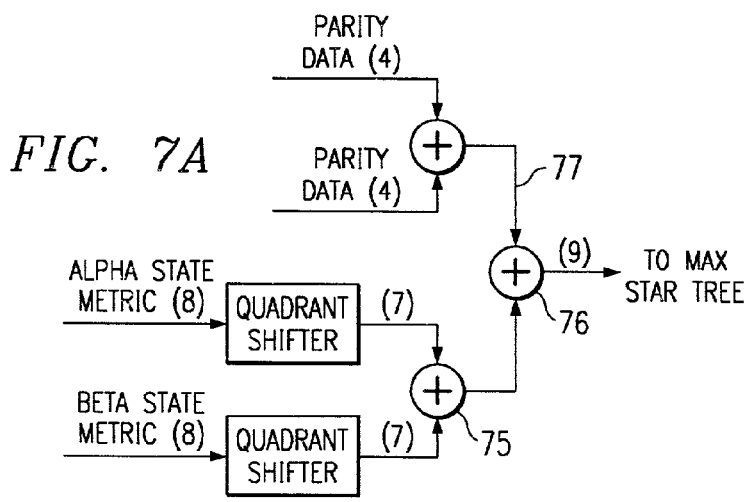
FIG. 7A diagrammatically illustrates an exemplary branch of an extrinsic block adder tree using quadrant shifters according to the invention.

The foregoing examples indicate that, when (for example) an 8 bit precision two's complement number is moved into quadrant 0 or quadrant 3, by adding 64 or 128, or by subtracting 64, the result (located in quadrant 0 or quadrant 3) can be expressed with only 7 bits of precision. Thus, the quadrant shifters shown in FIG. 7 advantageously reduce the precision requirements of any subsequent binary arithmetic, for example, the precision with which the extrinsic block of FIG. 5 must function. This is shown more clearly in FIG. 7A, which illustrates the bit precision effect of the quadrant shifters of FIG. 7 on a single branch of an adder tree (such as shown in FIG. 5). In FIG. 7A, the alpha and beta state metrics are provided as 8 bit numbers and applied to the quadrant shifters, which in turn produce 7 bit numbers. The 7 bit numbers are summed together at 75 to produce an 8 bit number, which is summed at 76 with a parity data summation 77 to produce a 9 bit number.

Figure 8:
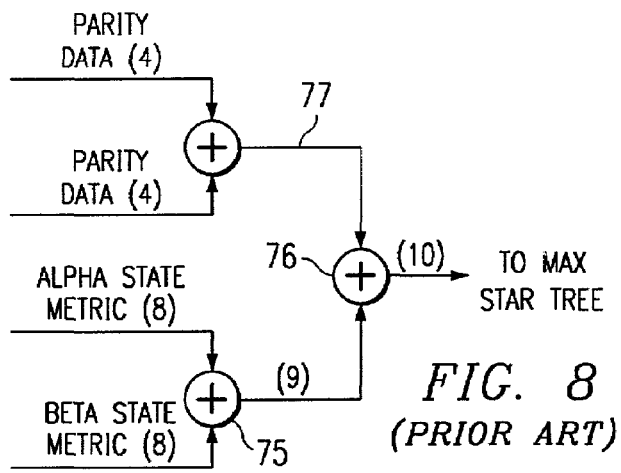
FIG. 8 illustrates a branch of a conventional extrinsic block adder tree such as shown in FIG. 5.

This is to be contrasted with the conventional adder tree branch shown in FIG. 8, which adder tree branch does not include the quadrant shifters of FIGS. 7 and 7A at its alpha and beta metric inputs. In the conventional example of FIG. 8, the 8 bit metrics are added at 75 to produce a 9 bit number which is then added at 76 to the parity data summation 77 to produce a 10 bit number.

Thus, for a conventional extrinsic block whose alpha and beta metric inputs are 8 bit numbers, the MAXstar tree must function with 10 bits of precision (FIG. 8), whereas the quadrant shifters of the present invention permit the MAXstar tree to function with 9 bits of precision (FIG. 7A). This 1 bit savings can result in a substantial amount of gate savings in the MAXstar tree, and the gate savings benefit increases with the size of the MAXstar tree.

Figure 9:
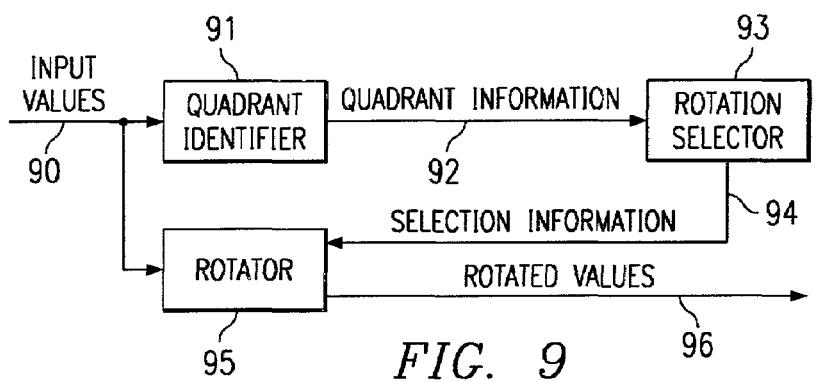
FIG. 9 diagrammatically illustrates exemplary embodiments of the quadrant shifters of FIGS. 7 and 7A.

FIG. 9 diagrammatically illustrates exemplary embodiments of the quadrant shifter of FIG. 7. In the example of FIG. 9, binary values 90 in two's complement format, for example alpha or beta state metrics, are input to a quadrant identifier 91 which is responsive to the input values for producing quadrant information 92 indicative of the quadrant or quadrants in which the values are located. This quadrant information is input to a rotation selector 93 which is responsive to the quadrant information for selecting the rotation (value adjustment) that will be applied to the input values (e.g., what number to add to or subtract from the input values). The rotation selector 93 outputs selection information 94 indicative of the selected rotation. This selection information is applied to a rotator (value adjuster) 95 which also receives the input values. The rotator 95 rotates the input values 90 as instructed by the selection information 94 to produce corresponding rotated values 96 (e.g., rotated alpha or beta state metrics for an extrinsic block).

Figure 10:
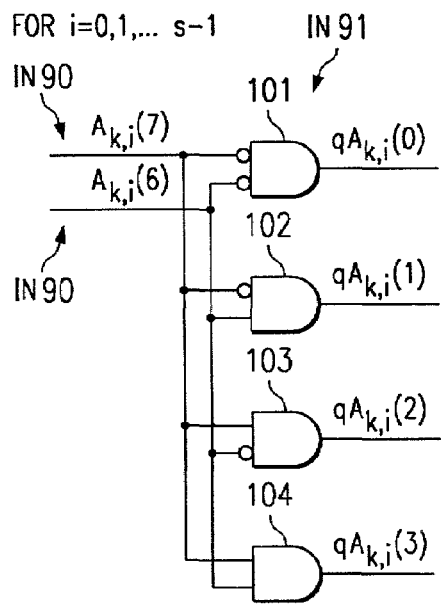

FIG. 10 diagrammatically illustrates a portion of an exemplary embodiment of the quadrant identifier 91 of FIG. 9. The example of FIG. 10 uses 8 bit precision. The inputs $A_{k,i}$ (7) and $A_{k,i}$ (6) represent bits 7 and 6 (the two most significant bits) of the ith state of the alpha metric at time k. These two most significant bits are used to determine the quadrant in which the value of the ith alpha state metric is located. The logic gates (AND gates in this example) and associated input inverters at 101, 102, 103 and 104 respectively detect values in quadrants 0, 1, 2 and 3. The signal $qA_{k,i}$ (0) is activated in response to detection of a value in quadrant 0, the signal $qA_{k,i}$ (1) is activated when a value in quadrant 1 is detected, the signal $qA_{k,i}$ (2) is activated when a value is detected in quadrant 2, and the signal $qA_{k,i}$ (3) is activated in response to detection of a value in quadrant 3. The logic illustrated in FIG. 10 can be replicated for each of the S states (corresponding to i=0, 1, ... S−1) of alpha at time k. In such embodiments, the structure at FIG. 10 would be replicated S−1 more times in order to accommodate the respective values of the other S−1 states of the alpha metric at time k.

FIG. 11 illustrates a further portion of an exemplary embodiment of the quadrant identifier 91 of FIG. 9. The structure of FIG. 11 includes a first OR gate 111 having inputs for receiving each of the S signals $qA_{k,i}$ (0) (for i=0, 1, ... S−1) output by the aforementioned S logic gates 101. Similarly, each of OR gates 112, 113 and 114 receives the S outputs from S associated logic gates at 102, 103 and 104, respectively. The outputs quad (0), quad (1), quad (2) and quad (3) of the OR gates 111, 112, 113 and 114 respectively represent quadrants 0, 1, 2 and 3 of FIG. 6. Because all alpha (or beta) state metric values must (by initial bit precision allocation) be located within a single quadrant or within two adjacent quadrants, only one or two of the OR gate outputs in FIG. 11 will be active at the same time, and any two simultaneously active outputs will represent adjacent quadrants of the FIG. 6 circle. The OR gate outputs in FIG. 11 provide the quadrant information at 92 in FIG. 9.

FIG. 12 illustrates in tabular format an exemplary embodiment of logic in the rotation selector 93 of FIG. 9. The input quadrant(s) column of FIG. 12 represents the possible combinations of the signals quad (0)–quad (3) of FIG. 11. More specifically, the signals quad (0)–quad (3) can indicate that the received values are located in quadrant 0, quadrant 1, quadrants 0 and 1, quadrant 2, quadrants 1 and 2, quadrant 3, quadrants 2 and 3, or quadrants 0 and 3. For each possible quadrant or quadrants, the table indicates the rotation operation that will be selected by the rotation selector 93 and communicated to the rotator 95. The rotator 95 then rotates the input values as instructed to obtain the desired rotated values located in the quadrant or quadrants (0, 3 or both) shown in the output quadrant(s) column of FIG. 12.

For example, and referencing FIGS. 9–11, if the quadrant information at 92 (as supplied, for example, by the OR gates 111–114 of FIG. 11) indicates that the input values are located in quadrants 0 and 1, then the rotation selector 93 selects the rotation operation of subtracting 64 and communicates this operation at 94 to the rotator 95. The rotator 95 then subtracts 64 from the input values in order to rotate those values into quadrants 0 and 3. As another example, if the quadrant information at 92 indicates that the input values are all located in quadrant 2, then the rotation selector 93 selects the rotation operation of adding 64, and communicates this operation at 94 to the rotator 95. The rotator 95 then adds 64 to the input values, thereby rotating those values into quadrant 3.

FIG. 13 diagrammatically illustrates exemplary embodiments of the rotator 95 of FIG. 9. The rotator in FIG. 13 includes a multiplexer 131 which receives, in this example, bit 6 of the ith alpha state metric and an inverted version of bit 6. The multiplexer 131 is controlled by the selection information 94 produced by the rotation selector 93 of FIG. 9. If the rotator is to add or subtract 64, then the selection information 94 controls the multiplexer 131 to select the inverted version of bit 6. Otherwise, for adding 128 or for performing no rotation, the selection information at 94 controls the multiplexer 131 to select bit 6. The structure of FIG. 13 can be replicated for each of S (i=0, 1 . . . S−1) states.

Although exemplary embodiments of the invention are described above in detail, this does not limit the scope of the invention, which can be practiced in a variety of embodiments.

What is claimed is:

1. A maximum a posteriori decoder, comprising:

an alpha block for producing alpha state metrics in two's complement format;

a beta block for producing beta state metrics in two's complement format;

an extrinsic block having an input coupled to said alpha block and said beta block for receiving said alpha state metrics and said beta state metrics as operands, said extrinsic block responsive to said operands for producing extrinsics data; and said extrinsic block including logic coupled to said input for determining, for each operand, whether an original value is within a predetermined proximity of a maximum positive/maximum negative value boundary associated with the two's complement format, and an adjuster coupled to said logic and responsive to a determination by said logic that any of the original operand values is within the predetermined proximity for adjusting all of the original operand values such that cross over from the maximum positive value to the maximum negative value is avoided and to produce respectively corresponding adjusted operand values for use in producing the extrinsics data.

2. The decoder of claim 1, wherein none of the adjusted operand values are within the predetermined proximity of the maximum positive/maximum negative value boundary.

3. The decoder of claim 1, wherein the adjusted operand values require less bits than the respectively corresponding original operand values.

4. The decoder of claim 1, wherein said adjuster is operable for adding a common value to each of the original operand values to produce the respective adjusted operand values.

5. The decoder of claim 1, wherein said adjuster is operable for subtracting a common value from each of the original operand values to produce the respective adjusted operand values.

6. The decoder of claim 5, wherein said adjuster is operable for adding a common value to each of the original operand values to produce the respective adjusted operand values.

* * * * *